United States Patent
Brady et al.

(10) Patent No.: US 7,002,475 B2
(45) Date of Patent: *Feb. 21, 2006

(54) COMBINATION RADIO FREQUENCY IDENTIFICATION TRANSPONDER (RFID TAG) AND MAGNETIC ELECTRONIC ARTICLE SURVEILLANCE (EAS) TAG

(75) Inventors: Michael John Brady, Brewster, NY (US); Thomas Anthony Cofino, Rye, NY (US); Dah-Weih Duan, Yorktown Heights, NY (US); Richard Joseph Gambino, Stony Brook, NY (US); Paul Andrew Moskowitz, Yorktown Heights, NY (US); Alejandro Gabriel Schrott, New York, NY (US); Robert Jacob Von Gutfeld, New York, NY (US)

(73) Assignee: Intermec IP Corp., Woodland Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/772,221

(22) Filed: Feb. 4, 2004

(65) Prior Publication Data

US 2005/0001725 A1 Jan. 6, 2005

Related U.S. Application Data

(63) Continuation of application No. 09/181,505, filed on Oct. 28, 1998, now abandoned, which is a continuation-in-part of application No. 09/071,413, filed on May 1, 1998, now Pat. No. 5,939,984.

(60) Provisional application No. 60/102,476, filed on Sep. 30, 1998, provisional application No. 60/093,088, filed on Jul. 16, 1998, provisional application No. 60/070,136, filed on Dec. 31, 1997.

(51) Int. Cl.
*G08B 13/14* (2006.01)
(52) U.S. Cl. .............. 340/572.7; 340/572.6; 343/787; 336/110
(58) Field of Classification Search ............ 340/572.7, 340/572.6; 343/787; 336/110
See application file for complete search history.

(56) References Cited

U.S. PATENT DOCUMENTS

| | | | | |
|---|---|---|---|---|
| 4,745,401 A | * | 5/1988 | Montean ................. 340/572.3 |
| 5,392,028 A | * | 2/1995 | Pichl ...................... 340/572.5 |
| 5,528,222 A | * | 6/1996 | Moskowitz et al. ...... 340/572.7 |
| 5,552,778 A | | 9/1996 | Schrott et al. |
| 5,552,790 A | * | 9/1996 | Gunnarsson ................. 342/51 |
| 5,576,693 A | * | 11/1996 | Tyren et al. ............. 340/572.4 |
| 5,771,021 A | * | 6/1998 | Veghte et al. ......... 343/700 MS |
| 5,812,065 A | | 9/1998 | Schrott et al. |
| 5,859,587 A | * | 1/1999 | Alicot et al. ............ 340/572.8 |
| 5,939,984 A | * | 8/1999 | Brady et al. ............ 340/572.1 |
| 5,986,562 A | * | 11/1999 | Nikolich .................. 340/693.5 |
| 6,130,612 A | | 10/2000 | Castellano et al. |
| 6,268,796 B1 | * | 7/2001 | Gnadinger et al. ...... 340/572.5 |
| 6,339,385 B1 | * | 1/2002 | Tuttle ................... 340/825.71 |
| 6,535,108 B1 | | 3/2003 | Schrott et al. |

* cited by examiner

*Primary Examiner*—Benjamin C. Lee
(74) *Attorney, Agent, or Firm*—O'Melveny & Myers LLP

(57) ABSTRACT

A combination of a radio frequency identification transponder (RFID Tag) and to a magnetic electronic article surveillance (EAS) device is disclosed. The present invention relates generally to radio frequency identification (RFID) systems, and more specifically to RFID transponders for use in RFID systems and the method for their assembly.

22 Claims, 3 Drawing Sheets

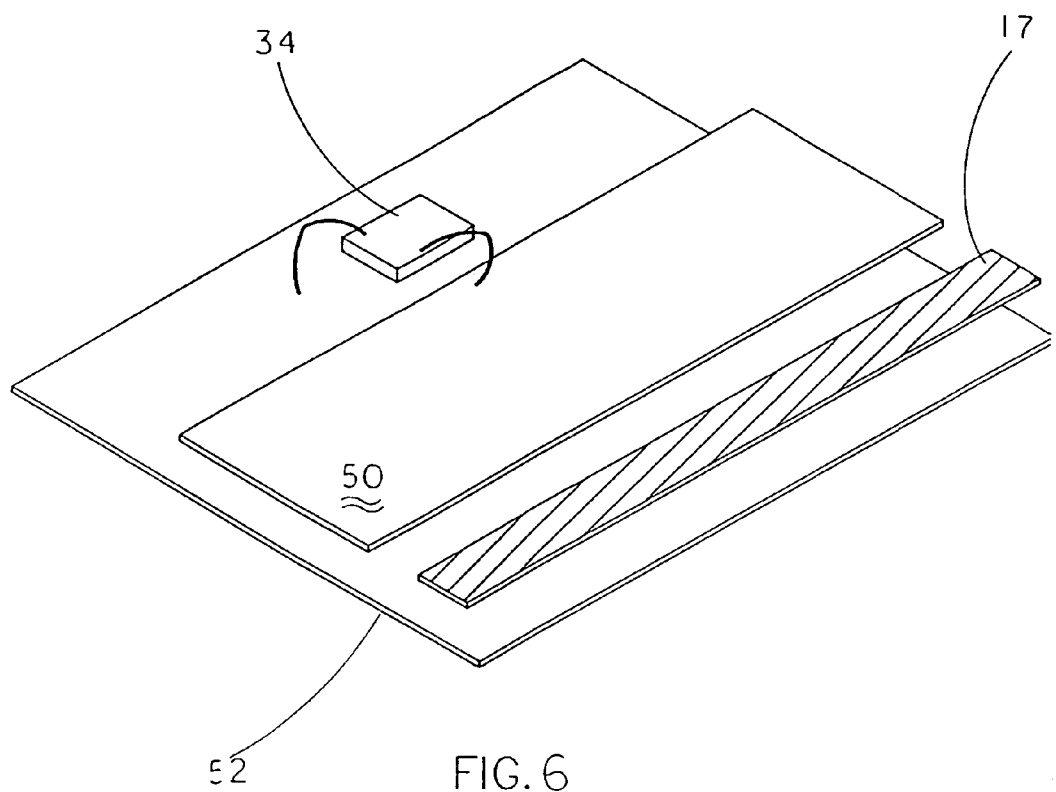
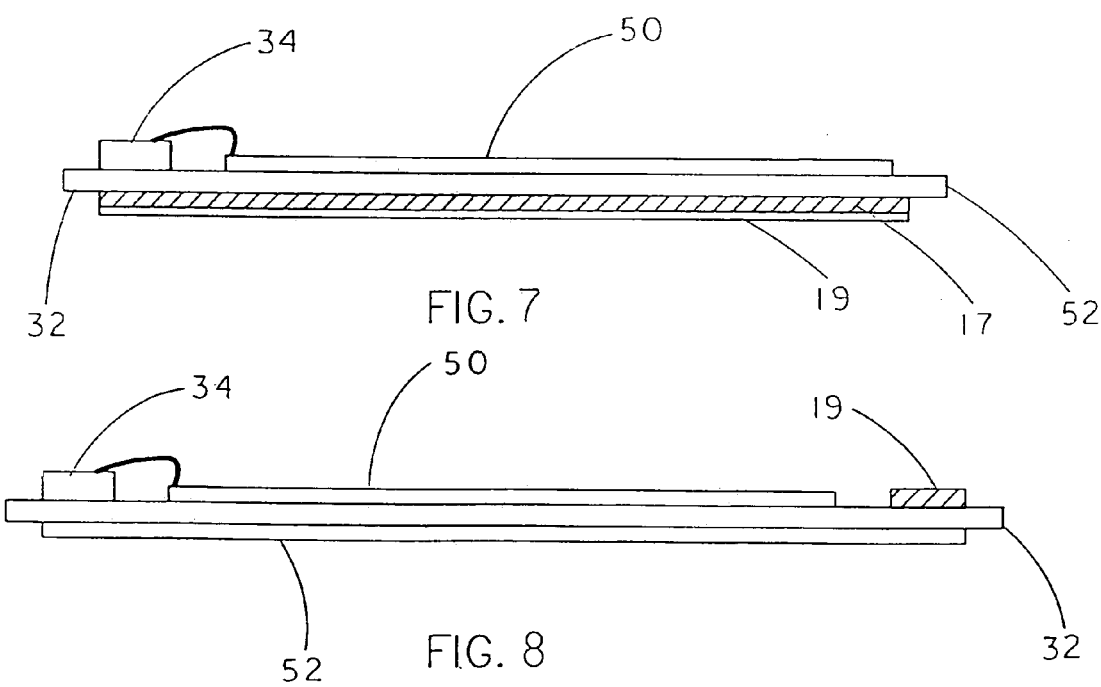

COMBINATION RADIO FREQUENCY IDENTIFICATION TRANSPONDER (RFID TAG) AND MAGNETIC ELECTRONIC ARTICLE SURVEILLANCE (EAS) TAG

CROSS-REFERENCE TO RELATED APPLICATIONS

The present application is a continuation of application Ser. No. 09/181,505 filed Oct. 28, 1998, now abandoned which is a continuation in part of U.S. application Ser. No. 09/071,413 filed May 1, 1998, now U.S. Pat. No. 5,939,984 issued Aug. 17, 1999. Said application Ser. No. 09/071,413 in turn claims the benefit of U.S. Provisional Application No. 60/070,136 filed Dec. 31, 1997. Said application Ser. No. 09/181,505 claims the benefit of U.S. Provisional Application No. 60/102,476 filed Sep. 30, 1998, and also claims the benefit of U.S. Provisional Application No. 60/093,088 filed Jul. 16, 1998. Said application Ser. Nos. 09/071,413, 60/093,088 and 60/102,476 are herein incorporated by reference in their entirety.

INCORPORATION BY REFERENCE

The following US Patents and Patent Applications are hereby incorporated herein by reference in their entirety:

| U.S. Pat. No. | Issue Date | Filing Date | Attorney Docket No. |
|---|---|---|---|
| U.S. Pat. Nos. | | | |
| 5,521,601 | May 28, 1996 | Apr. 21, 1995 | YO995-0088 |
| 5,528,222 | Jun. 18, 1996 | Sep. 09, 1994 | YO994-180 |
| 5,538,803 | Jul. 23, 1996 | Nov. 23, 1994 | YO994-0073 |
| 5,550,547 | Aug. 27, 1996 | Sep. 12, 1994 | YO994-185 |
| 5,552,778 | Sep. 03, 1996 | Nov. 23, 1994 | YO994-0232 |
| 5,554,974 | Sep. 10, 1996 | Nov. 23, 1994 | YO994-0071 |
| 5,563,583 | Oct. 08, 1996 | Nov. 23, 1994 | YO994-070 |
| 5,565,847 | Oct. 15, 1996 | Nov. 23, 1994 | YO994-0072 |
| 5,606,323 | Feb. 25, 1997 | Aug. 31, 1995 | YO995-157 |
| 5,635,693 | Jun. 03, 1997 | Feb. 02, 1995 | YO994-0215 |
| 5,673,037 | Sep. 30, 1997 | Sep. 09, 1994 | YO994-184 |
| 5,680,106 | Oct. 21, 1997 | Oct. 27, 1995 | YO995-0219 |
| 5,682,143 | Oct. 28, 1997 | Sep. 09, 1994 | YO994-170 |
| 5,729,201 | Mar. 17, 1998 | Jun. 29, 1995 | YO995-109 |
| 5,729,697 | Mar. 17, 1998 | Apr. 24, 1995 | YO995-076 |
| 5,736,929 | Apr. 07, 1998 | Jun. 07, 1996 | YO996-085 |
| 5,739,754 | Apr. 14, 1998 | Jul. 29, 1996 | YO996-115 |
| 5,767,789 | Jun. 16, 1998 | Aug. 31, 1995 | YO994-213 |
| 5,777,561 | Jul. 07, 1998 | Sep. 30, 1996 | YO996-178 |
| 5,786,626 | Jul. 28, 1998 | Mar. 25, 1996 | YO996-031 |
| 5,812,065 | Sep. 22, 1998 | Dec. 08, 1995 | YO995-124X |
| 5,821,859 | Oct. 13, 1998 | | |
| U.S. Nonprovisional Patent Applications | | | |
| 5,729,697 | Mar. 17, 1998 | Apr. 24, 1995 | YO995-076 |
| 5,736,929 | Apr. 07, 1998 | Jun. 07, 1996 | YO996-085 |
| 5,777,561 | Jul. 07, 1998 | Sep. 30, 1996 | YO996-178 |

| Application No. | Filing Date | Attorney Docket No. |
|---|---|---|
| U.S. Nonprovisional Patent Applications | | |
| 08/681,741 | Jul. 29, 1996 | YO996-037 |
| 08/660,249 | Jun. 07, 1996 | YO996-084 (allowed Apr. 28, 1998) |
| 08/621,784 | Mar. 25, 1996 | YO996-031 |
| 08/626,820 | Apr. 03, 1996 | YO995-158 |
| 08/646,539 | May 08, 1996 | YO996-068 |

| Application No. | Filing Date | Attorney Docket No. |
|---|---|---|
| -continued | | |
| 08/681,741 | Jul. 29, 1996 | YO996-037 |
| 08/694,606 | 08/09/996 | YO995-218 |
| 08/790,639 | Jan. 29, 1997 | YO997-024 |
| 08/790,640 | Jan. 29, 1997 | YO997-023 |
| 08/733,684 | Oct. 17, 1996 | YO996-195 |
| 08/862,149 | May 23, 1997 | YO997-116 |
| 08/862,912 | May 23, 1997 | YO997-115 |
| 08/862,913 | May 23, 1997 | YO997-114 |
| 08/909,719 | Aug. 12, 1997 | YO995-109B (allowed) |
| 08/935,989 | Oct. 23, 1997 | YO997-310 |
| U.S. Provisional Patent Applications | | |
| 60/073,102 | Jan. 30, 1998 | YO897-0028P1 |
| 60/074,605 | Feb. 13, 1998 | YO897-0259P1 |
| 60/077,879 | Mar. 13, 1998 | YO997-0038P1 |
| 60/078,287 | Mar. 17, 1998 | YO897-0661P1 |
| 60/091,350 | Jul. 01, 1998 | YO897-0259P2 |
| 60/078,304 | Mar. 17, 1998 | YO897-0662P1 |
| 60/093,088 | Jul. 16, 1998 | 38384P1 |

The following further documents are also incorporated herein by reference in their entirety:

IBM Technical Disclosure Bulletin

IBM Technical Disclosure Bulletin: Vol. 38 No. 08, August 1995, page 17, "Multifunction Credit Card Package," by Brady, Moskowitz, and Murphy.

Literature Reference

D. Friedman, H. Heinrich, D. Duan, "A low-power CMOS integrated circuit for field-powered radio frequency identification (RFID) tags," 1997 Digest of Technical Papers of the IEEE International Solid-State Circuits Conference (ISSCC), San Francisco, Calif., February 1997.

| Application No. | Filing Date | Attorney Docket No. |
|---|---|---|
| PCT Published International Applications | | |
| PCT/GB96/00061 | Jan. 15, 1996 | UK 9-94-066 PCT |
| PCT/EP95/03703 | Oct. 20, 1995 | YO994-242 PCT |
| UK Published Application | | |
| 9710025.9 | May 19, 1997 | YO9-96-084 |

FIELD OF THE INVENTION

The present invention relates to an identification tag and more particularly to an identification tag having a large number of bits of information, where the identification tag has an electronic article surveillance function which is difficult to defeat.

DESCRIPTION OF THE RELATED ART

Radio frequency identification transponders (RFID Tags) have been developed in the last years to take advantage of the fall in semiconductor logic and memory prices. Such tags are available having a single silicon chip attached to a wire or patch antenna. Such tags, however, may be shielded from the high frequency RF used to communicate with the tags. The anti-theft properties of the RFID tags are suspect.

Magnetic electronic article surveillance (EAS) tags are much less easily shielded from the low frequency magnetic detection fields. Such EAS tags as described below, however, have possibilities of storing only a few bits of information.

Some conventional magnetic EAS tags have employed the Barkhausen jump effect. Generally, the Barkhausen effect is characterized by a tendency for magnetization induced in a magnetic material to change in discrete steps as an external magnetic field is increased or decreased. (The material is said to be a non-linear magnetic material if the magnetisation of the material is not proportional to the external magnetic field.) A large temporal flux change, df./dt, occurs when such a step takes place, and a sizable voltage may be induced in a sensing or pickup coil.

For example, U.S. Pat. No. 5,181,020 describes a thin-film magnetic tag having a magnetic thin film formed on a polymer substrate and a method for producing the same. The thin film exhibits a large Barkhausen discontinuity without intentional application of external torsional or tensile stress on use. A particular disclosed use is as a marker or tag for use in an article surveillance system wherein articles may be identified by interrogating the tagged article in a cyclic magnetic field of a predetermined frequency in a surveillance area and detecting a harmonic wave of the magnetic field generated by the tag in the surveillance area. This conventional system is only a single bit element using a single Barkhausen layer with no ability to develop a code to distinguish items.

U.S. Pat. No. 5,313,192 describes another single bit tag which relies on the Barkhausen effect. The tag of this invention is selected to include a first component comprised of a soft magnetic material which constitutes the bulk of the tag. A second component comprised of a semi-hard or hard magnetic material is integral with the first component. The tag is conditioned such that the second component has activating and deactivating states for placing the tag in active and deactivated states, respectively. Such conditioning includes subjecting the composite tag to predetermined magnetic fields during thermal processing stages. By switching the second component between its activating and deactivating states the tag can be switched between its active and deactived states. A reusable tag with desired step changes in flux which is capable of deactivation and reactivation is thereby realized.

U.S. Pat. No. 4,980,670 describes a one bit magnetic tag formed from a magnetic material having domains with a pinned wall configuration. The resulting hysteresis characteristic for that material is such that upon subjecting the material to an applied alternating magnetic field, the magnetic flux of the material undergoes a regenerative step change in flux (Barkhausen jump) at a threshold value when the field increases to the threshold value from substantially zero and undergoes a gradual change in flux when the field decreases from the threshold value to substantially zero. For increasing values of applied field below the threshold, there is substantially no change in the magnetic flux of the material. The tag may be deactivated by preventing the domain walls from returning to their pinned condition by, for example, application of a field of sufficiently high frequency and/or amplitude.

U.S. Pat. No. 4,940,966 describes the use of a plurality of magnetic elements in predetermined associations (e.g. with predetermined numbers of magnetic elements and with predetermined spacings between said elements), for identifying or locating preselected categories of articles. When the articles are caused to move relative to a predetermined interrogating magnetic field, each particular association of magnetic elements gives rise to a magnetic signature whereby the article or category of article carrying each of the predetermined associations can be recognized and/or located.

U.S. Pat. No. 4,660,025 describes a marker for use in an electronic surveillance system. The marker, which can be in the form of a wire or strip of magnetic amorphous metal, is characterized by having retained stress and a magnetic hysteresis loop with a large Barkhausen discontinuity. When the marker is exposed to an external magnetic field whose field strength, in the direction opposing the instantaneous magnetic polarization of the marker, exceeds a predetermined threshold value, a regenerative reversal of the magnetic polarization of the marker occurs and results in the generation of a harmonically rich pulse that is readily detected and easily distinguished.

U.S. Pat. No. 5,175,419 describes a method for interrogating an identification tag comprised of a plurality of magnetic, thin wires or thin bands which have highly rectangular hysteresis curves and different coercive forces. The wires or bands are preferably of amorphous material, but means for obtaining the highly rectangular hysteresis curves and different coercive forces are not taught; nor is the concept taught of using a time varying magnetic field superimposed on a ramp field for interrogation.

U.S. Pat. No. 5,729,201 describes an inexpensive multibit magnetic tag is described which uses an array of amorphous wires in conjunction with a magnetic bias field. The tag is interrogated by the use of a ramped field or an ac field or a combination of the two. The magnetic bias is supplied either by coating each wire with a hard magnetic material which is magnetized or by using magnetized hard magnetic wires or foil strips in proximity to the amorphous wires. Each wire switches at a different value of the external interrogation field due to the differences in the magnetic bias field acting on each wire.

The above identified U.S. Patents and the following related U.S. Patents assigned to the assignee of the present invention are hereby incorporated by reference: U.S. Pat. Nos. 5,528,222; 5,550,547; 5,552,778; 5,554,974; 5,538,803; 5,563,583; 5,565,847; 5,606,323; 5,521,601; 5,635,693; 5,673,037; 5,682,143; 5,680,106; 5,729,201; and 5,729,607. U.S. Patent applications assigned to the assignee of the present invention include: Ser. No. 08/303,965 filed Sep. 9, 1994 entitled RF Group Select Protocol, by Cesar et al.; Ser. No. 08/621,784, filed on Mar. 25, 1996 entitled "Thin Radio Frequency Transponder with Lead Frame" by Brady et al. (pending); Ser. No. 08/626,820, Filed: Apr. 3, 1996, entitled "Method of Transporting RF Power to Energize Radio Frequency Transponders", by Heinrich et al.; application submitted Aug. 9, 1996 entitled RFID System with Broadcast Capability by Cesar et al.; application submitted Jul. 29, 1996 entitled RFID transponder with Electronic Circuitry Enabling and Disabling Capability, by Heinrich et al.; Ser. Nos. 08/592,250; Ser. No. 08/496,838; Ser. No. 08/496,838; Ser. No. 08/909,719; Ser. Nos. 08/621,784, 660,249; Ser. No. 08/660,261; Ser. No. 08/790,640; Ser. No. 08/790,639; and Ser. No. 08/681,742. The above identified U.S. Patents and U.S. Patent applications are hereby incorporated by reference.

SUMMARY OF THE INVENTION

An RFID tag is combined with a magnetic EAS tag. The conducting elements of the RFID tag such as the antenna or the parasitic elements used to tune the antenna characteristics may be wholly or partially made from a non-linear magnetic material which produces a large signal in a magnetic EAS detection field. The non-linear magnetic material may be coated or electroplated or electrolessly plated with a good electrical conductor to enhance the antenna characteristics of the RFID tag. The non-linear magnetic material may be advantageously connected to dielectric material used to support and/or encapsulate the antenna and electronic components of the RFID tag.

BRIEF DESCRIPTION OF THE DRAWINGS

FIG. 6 shows a perspective sketch of a patch antenna mounted coplanar with a non-linear magnetic material;

FIG. 7 shows an elevation sketch of the apparatus of FIG. 5; and

FIG. 8 shows an elevation sketch of the apparatus of FIG. 6 showing the supporting dielectric material.

DETAILED DESCRIPTION OF THE INVENTION

Figure 1:
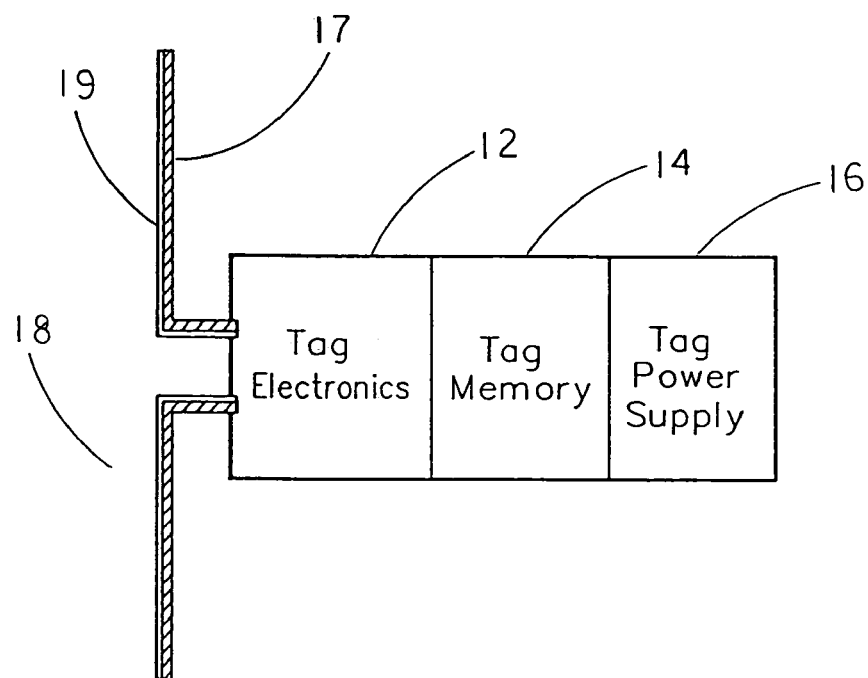
FIG. 1 shows block diagram of an RF tag of the invention.

FIG. 1 shows block diagram of an RF tag 10 having tag electronics 12, a tag memory 14, and a tag power supply 16 connected to a tag antenna 18. The tag antenna 18 is shown in this embodiment made from a non-linear magnetic material 17. Such non-linear magnetic materials may have electrical conductivity insufficient for high quality antennas, and an alternative most preferred embodiment is to coat the non-linear magnetic material with a good electrical conducting material 19 such as copper, gold, or a conducting polymer. The conducting material 19 need only be as thick as the skin depth of the high frequency RF signals sent to the RFID tag 10. Such conducting material 19 may be coated on the non-linear magnetic material 17 by coating processes well known in the art such as evaporation, electroplating, or electroless plating.

Figure 2:
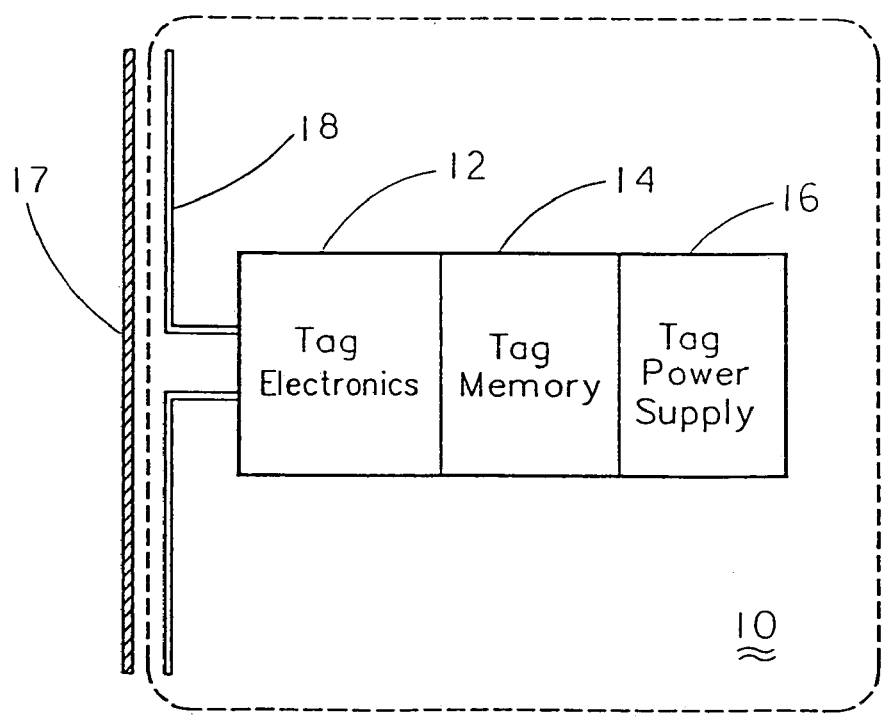
FIG. 2 shows a block diagram of an RFID tag.

FIG. 2 shows a sketch of an RFID tag 10 having a tag antenna 18 electrically and spatially separated from a non-linear magnetic material 17. In the embodiment shown, the non-linear material is shown as a wire placed as a parasitic element to a dipole antenna 18 of the RFID tag 10. A preferred embodiment in this case also is to have the non-linear material 17 coated with an electrically conducting material if the electrical resistivity of the non-linear material 17 is too high.

Figure 3:
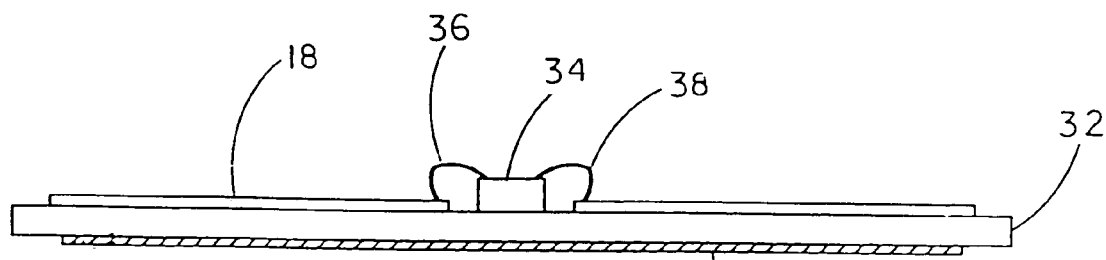
FIG. 3 shows an elevation sketch of a physical layout for the sketch of FIG. 2.

FIG. 3 shows an elevation sketch of a physical layout for the sketch of FIG. 2. The dipole antenna 18 is connected to a silicon chip 34 containing the tag memory, tag electronics, and tag power supply by wires 36 and 38. The antenna 18 and the chip 34 are mounted on a dielectric material 32. The non-linear material 17 is mounted on the opposite side of the dielectric material 32 to the antenna 18 and chip 34. In this embodiment, the non-linear material 17 may once again be coated with a good electrical conductor.

Figure 4:
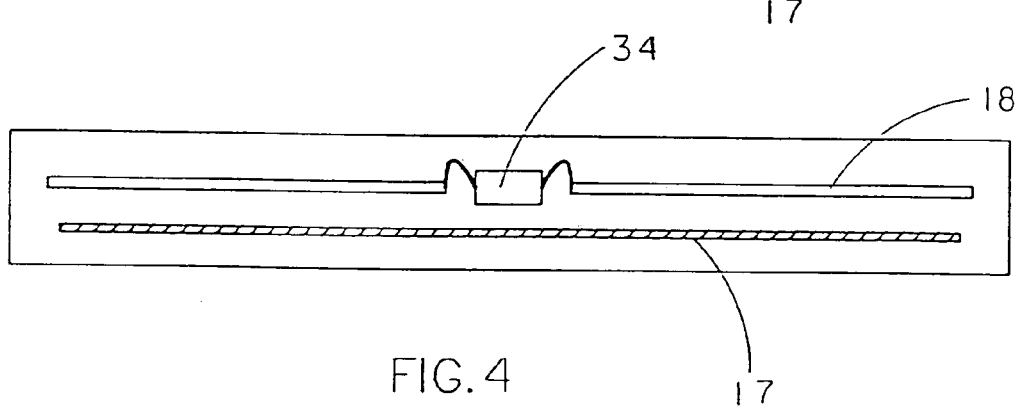
FIG. 4 shows an alternative arrangement of FIG. 2.

FIG. 4 shows an alternative arrangement of FIG. 2. The silicon chip 34, the antenna 18, and the non-linear material 17 are all mounted on the same side of a supporting structure made of dielectric 32. In this embodiment, the non-linear material 17 may once again preferably be coated with a good electrical conductor.

Figure 5:
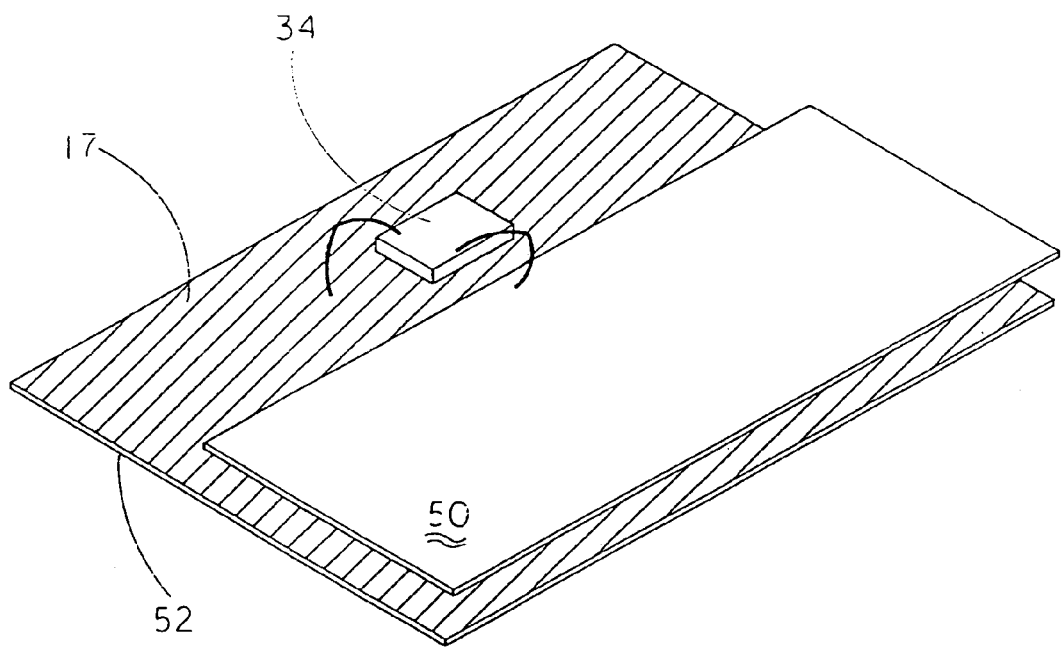
FIG. 5 shows perspective sketch of a preferred alternative antenna arrangement for an RFID tag.

FIG. 5 shows perspective sketch of a preferred alternative antenna arrangement for an RFID tag. A silicon chip 34 is electrically attached to an electrially conducting patch antenna 50. The silicon chip is also electrically attached to an electrically conducting ground plane 52, which is spatially separated from the patch antenna 50 by a dielectric material (not shown). In the embodiment shown in FIG. 5, the electrically conducting ground plane 52 is made from non-linear magnetic material 17. In this embodiment, the non-linear material 17 may once again preferably be coated with a good electrical conductor.

FIG. 6 shows a perspective sketch of a patch antenna mounted coplanar with a non-linear magnetic material 17. The magnetic material may be in the form of a wire or in the form of a sheet as shown in the diagram.

FIG. 7 shows an elevation sketch of the apparatus of FIG. 5. In this case, the dielectric material 32 supporting the patch antenna, the chip 34, and the ground plane 52 is explicitly shown. The alternative embodiment having a conducting material 19 coating the non-linear material is also shown. In this case, the material of the patch antenna 50 is alternatively made of a non-linear magnetic material instead of the ground plane 52. Once again, the non-linear material 17 may once again preferably be coated with a good electrical conductor.

FIG. 8 shows an elevation sketch of the apparatus of FIG. 6 showing the supporting dielectric material 32.

We claim as our invention:

1. An apparatus comprising:
   (a) a radio frequency tag including an integrated circuit package containing at least tag electronic circuitry, a tag power supply integrated with said tag electronic circuitry, and a tag antenna operatively coupled to the integrated circuit package;
   (b) a magnetic material providing an article surveillance response in the presence of an interrogating field; and
   (c) the radio frequency tag communicating information by modulating reflectance characteristics of the tag antenna, wherein the integrated circuit package comprises a semiconductor device containing the tag electronic circuitry and the tag power supply, and the tag antenna comprises an antenna element electrically connected to the semiconductor device, and wherein a further antenna element cooperates with the first-mentioned antenna element to form the tag antenna, the further antenna element comprising said magnetic material coated with an electrically conducting material.

2. An apparatus comprising:
   (a) a radio frequency tag including an integrated circuit package containing at least tag electronic circuitry, a tag power supply integrated with said tag electronic circuitry, and a tag antenna operatively coupled to the integrated circuit package;
   (b) a magnetic material providing an article surveillance response in the presence of an interrogating field; and
   (c) the radio frequency tag communicating information by modulating reflectance characteristics of the tag antenna, wherein the integrated circuit package comprises a semiconductor device containing the tag electronic circuitry and the tag power supply, and the tag antenna comprises an antenna element electrically connected to the semiconductor device, and wherein the tag antenna comprises a patch antenna electrically connected to the semiconductor device, the patch antenna having a ground plane, wherein the patch antenna comprises said magnetic material coated with an electrically conducting material.

3. An apparatus comprising:
(a) a radio frequency transponder including a transponder chip containing at least chip electronic circuitry and a chip power supply, and a transponder antenna connected to the transponder chip;
(b) a magnetic material providing a response in the presence of an interrogating field; and
(c) the radio frequency transponder communicating information by modulating reflectance characteristics of the transponder antenna, wherein the tag antenna comprises a patch antenna electrically connected to the transponder chip, the patch antenna having a ground plane, wherein the patch antenna comprises said magnetic material coated with an electrically conducting material.

4. An apparatus comprising:
(a) a radio frequency tag including an integrated circuit semiconductor device containing at least tag electronic circuitry and a tag power supply, and a tag antenna connected to the semiconductor device;
(b) a magnetic material providing a response in the presence of an interrogating field; and
(c) the radio frequency tag communicating information by modulating reflectance characteristics of the tag antenna, wherein the tag antenna comprises an antenna element electrically connected to the semiconductor device, wherein a further antenna element cooperates with the first-mentioned antenna element to form the tag antenna, the further antenna element comprising said magnetic material coated with an electrically conducting material.

5. An apparatus comprising:
(a) a radio frequency tag including an integrated circuit package containing at least tag electronic circuitry and a tag power supply, and a tag antenna connected to the integrated circuit package;
(b) a magnetic material providing an article surveillance response in the presence of an interrogating field; and
(c) the radio frequency tag communicating information by modulating reflectance characteristics of the tag antenna, wherein the tag antenna comprises said magnetic material coated with an electrically conducting material.

6. The apparatus of claim 5, wherein the tag antenna comprises a patch antenna electrically connected to the integrated circuit package.

7. The apparatus of claim 6, wherein the patch antenna further comprises a ground plane.

8. The apparatus of claim 6, wherein the patch antenna comprises a dielectric sheet having a first side and a second side, a first electrically conducting material attached to the first side, and a second electrically conducting material attached to the second side, wherein the semiconductor device is electrically connected to the first electrically conducting material and the second electrically conducting material, and wherein the magnetic material is attached to the dielectric sheet.

9. An apparatus comprising:
(a) a radio frequency transponder including an integrated circuit package containing at least transponder electronic circuitry and a transponder power supply, and a transponder antenna connected to the integrated circuit package;
(b) a magnetic material providing a response in the presence of an interrogating field; and
(c) the radio frequency transponder communicating information by modulating reflectance characteristics of the transponder antenna, wherein the transponder antenna comprises said magnetic material coated with an electrically conducting material.

10. The apparatus of claim 9, wherein the transponder antenna comprises a patch antenna electrically connected to the integrated circuit package.

11. The apparatus of claim 10, wherein the patch antenna further comprises a ground plane.

12. The apparatus of claim 10, wherein the patch antenna comprises a dielectric sheet having a first side and a second side, a first electrically conducting material attached to the first side, and a second electrically conducting material attached to the second side, wherein the semiconductor device is electrically connected to the first electrically conducting material and the second electrically conducting material, and wherein the magnetic material is attached to the dielectric sheet.

13. An apparatus comprising:
(a) a radio frequency tag including an integrated circuit semiconductor device containing at least tag electronic circuitry and a tag power supply, and a tag antenna connected to the semiconductor device;
(b) a magnetic material providing a response in the presence of an interrogating field; and
(c) the radio frequency tag communicating information by modulating reflectance characteristics of the tag antenna;
wherein the tag antenna comprises an antenna element electrically connected to the semiconductor device; and
wherein a further antenna element cooperates with the first-mentioned antenna element to form the tag antenna, the further antenna element comprising said magnetic material coated with an electrically conducting material.

14. An apparatus, comprising:
a radio frequency (RF) transponder (tag), the RF tag comprising a tag antenna, tag electronics for storing information in a codable and recodable memory and for communicating information to a base station by modulating reflectance characteristics of the tag antenna, and a tag power supply; and
a non-linear magnetic material operably associated with said RF tag, the non-linear magnetic material generating a varying electronic article surveillance magnetic field when the non-linear magnetic material is in a magnetic field;
wherein said magnetic field is sinusoidally varying with a frequency $f_0$, the electronic article surveillance magnetic field varying with a frequency having higher harmonics of $f_0$.

15. An apparatus, comprising:
a radio frequency (RF) transponder (tag), the RF tag comprising a tag antenna, tag electronics for storing information in a codable and recodable memory and for communicating information to a base station by modulating reflectance characteristics of the tag antenna, and a tag power supply; and
a non-linear magnetic material operably associated with said RF tag, the non-linear magnetic material generating a varying electronic article surveillance magnetic field when the non-linear magnetic material is in a magnetic field;

wherein the tag antenna comprises the non-linear magnetic material.

16. The apparatus of claim 15, wherein the tag antenna comprises a first wire electrically connected to a semiconductor device incorporating the tag electronics.

17. The apparatus of claim 16, wherein the first wire comprises non-linear magnetic material.

18. The apparatus of claim 17, wherein the non-linear magnetic material is coated with an electrically conducting material.

19. The apparatus of claim 16, wherein a second wire cooperates with the first wire to form the tag antenna, the second wire comprising non-linear magnetic material.

20. The apparatus of claim 19, wherein the non-linear magnetic material is coated with an electrically conducting material.

21. The apparatus of claim 16, wherein the tag antenna comprises a patch antenna electrically connected to a semiconductor device incorporating the tag electronics, the patch antenna having a ground plane.

22. The apparatus of claim 21, wherein the non-linear magnetic material is coated with an electrically conducting material.

* * * * *